United States Patent [19]
Onishi et al.

[11] Patent Number: 5,383,151
[45] Date of Patent: Jan. 17, 1995

[54] DYNAMIC RANDOM ACCESS MEMORY

[75] Inventors: Shigeo Onishi, Nara; Kenichi Tanaka, Fukuyama; Keizo Sakiyama, Kashihara, all of Japan

[73] Assignee: Sharp Kabushiki Kaisha, Osaka, Japan

[21] Appl. No.: 101,248

[22] Filed: Aug. 2, 1993

[51] Int. Cl.[6] ............................................. G11C 11/24
[52] U.S. Cl. .................................. 365/149; 365/51; 365/63; 257/905; 257/907
[58] Field of Search ............... 257/905, 906, 907, 908; 365/51, 149, 63

[56] References Cited
U.S. PATENT DOCUMENTS 4,962,476 10/1990 Kawada ........................ 365/51
5,033,022 7/1991 Segawa ........................ 365/51

*Primary Examiner*—Eugene R. LaRoche
*Assistant Examiner*—F. Niranjan
*Attorney, Agent, or Firm*—Nixon & Vanderhye

[57] ABSTRACT

A dynamic random access memory includes a plurality of DRAM cell units having a bit contact region and DRAM cells formed on an active region, wherein the DRAM cells each comprised of a transistor and a capacitor connected to the transistor are arranged symmetrically to the right and left sides in a bit contact connected with the active region to form the DRAM cell unit; and the DRAM cell units are arranged with a prescribed pitch in the direction of X and arranged in the direction of Y shifted with one third of the pitch toward the direction of X.

4 Claims, 5 Drawing Sheets

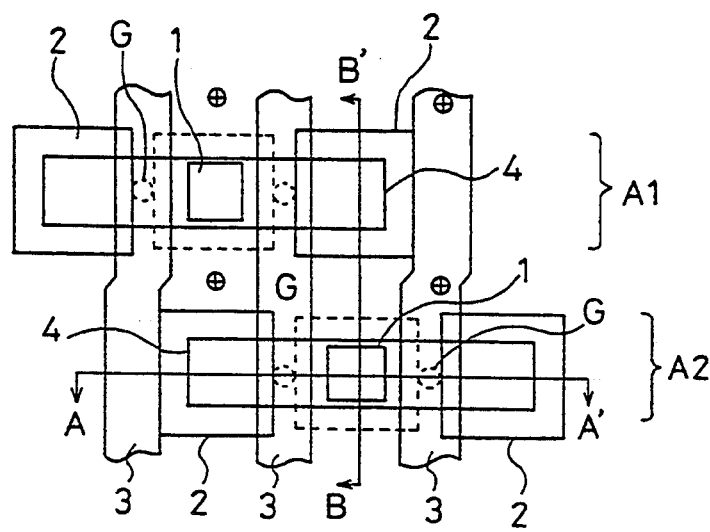
Fig.1(b)  Fig.1(a)
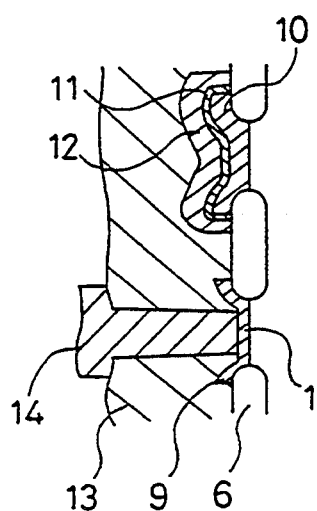
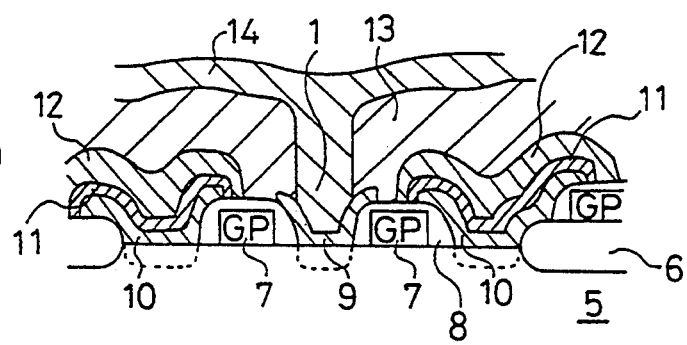
Fig.1(c)

DYNAMIC RANDOM ACCESS MEMORY

BACKGROUND OF THE INVENTION

1. Field of the Invention

The invention relates to a dynamic random access memory (hereinafter referred to DRAM). More particularly, it relates to a layout structure of the DRAM using capacitor elements with a ferroelectric film.

2. Description of the Related Art

Conventionally, a DRAM comprising a memory cell in which one transistor element and one capacitor element are combined is known as a semiconductor memory device having high integration. The capacitor element applied for this conventional DRAM has been mainly formed of a capacitor made of an insulating film such as $SiO_2$ and SiN.

However, since such an insulating film has a relatively low relative dielectric constant ($\epsilon$) ($SiO_2$:($\epsilon$)=3.9; SiN:($\epsilon$)=7.8), it is necessary to reduce a thickness of the film to a certain level in the limited cell size for having higher integration. For example, in order to obtain integration of the level of 64 Mbit, the film thickness has to be reduced to about 50 angstroms. It is difficult to manufacture such a thin insulating film by the present state of art with sufficient reliability.

It has also been conventional to form a DRAM in which a ferroelectric film such as PZT and PLZT is used instead of the insulating film described above for the capacitor. In such a DRAM, since the ferroelectric film has a high relative dielectric constant ($\epsilon$=about 500–1000), the capacitor element formation area can be reduced and the limitation of the film thickness can be relaxed.

A conventional type DRAM having a layout structure as shown in FIG. 5 (folded bit line type) has been proposed. In this Figure, the reference numeral 1 designates a bit contact formation region, 2 designates a capacitor element formation area especially showing capacitor electrode pattern, 3 designates a word line, 4 designates an active region and G designate a gate, respectively.

As described above, the conventional ferroelectric type DRAM has the a layout structure of DRAM cell units A each of which comprises a pair of DRAM in which ferroelectric type capacitors are disposed through the intermediary of respective transistors on the right and left side in the bit contact formation region and are arranged in X-Y direction.

However, such a conventional type DRAM has a drawback as to integration of the device because a constant distance (a) is kept between the DRAM cell units arranged in the direction of X as shown in FIG. 5.

In addition, it is a problem that the density of placement of the bit contact and capacitor element 2 in the DRAM cell unit A arranged in the direction Y is partially great and partially small, respectively.

SUMMARY OF THE INVENTION

The present invention provides a dynamic random access memory which includes a plurality of DRAM cell units having a bit contact region and DRAM cells formed on an active region, wherein the DRAM cells each comprised of a transistor and a capacitor connected to the transistor are arranged symmetrically to the right and left sides in a bit contact connected with the active region to form the DRAM cell unit; and the DRAM cell units are arranged with a prescribed pitch in the direction of X and arranged in the direction of Y shifted with one third of the pitch toward the direction of X.

BRIEF DESCRIPTION OF THE DRAWINGS

FIGS. 1(a) to 1(c) show an example of a main portion of the dynamic random access memory of the present invention.

DETAILED DESCRIPTION OF THE INVENTION

Figure 2:
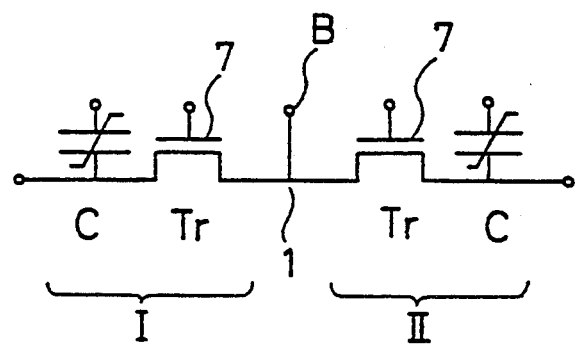
FIG. 2 is an equivalent circuit of the DRAM cell unit of the FIG. 1.

In the dynamic random access memory of the present invention, a number of DRAM cell units each of which is formed of a pair of DRAM cells are arranged in X-Y direction. The DRAM cell unit is formed in one active region where a bit contact formation region is disposed approximately in the center thereof and a pair of DRAM cells is arranged symmetrically to the right and left sides of the bit contact. The DRAM cell is formed of one transistor element and one capacitor element connected to the transistor and the transistor is connected to the bit contact. Each of the DRAM cell units described above is shifted such that one of the capacitor element formation areas of the DRAM cell unit is placed between two capacitor element formation areas of other DRAM cell units adjacent to each other in the direction of Y. In other words, the DRAM cell units arranged with a certain pitch in the direction of X are arranged in the direction of Y to shift with one third of the pitch toward the direction of X, thereby realizing an integrated layout structure.

The DRAM cell of the present invention can be formed by a known method. For example, a polysilicon film or a polysilicon/W silicide film is formed about 1500 to 3000 angstroms or 500–1500/500–1500 angstroms in thickness respectively by a CVD method or other known methods on a substrate having an isolation film and then patterned in a desired shape to form a gate electrode of a transistor. After forming an insulating film on the gate electrode, a lower electrode, an insulating film and an upper electrode of the capacitor are formed in sequence by a known method. The lower electrode of the capacitor may be formed with an electrode material. The material is not specified in particular but preferably polysilicon or platinum film is used. In this case, the film thickness is preferably about 2000 to 3000 angstroms. The capacitor insulating film is preferred to be a ferroelectric film such as PZT and PLZT and its film thickness is preferably about 1000 to 3000 angstroms. As the upper electrode of the capacitor, the same material as the lower electrode can be used. After forming the transistor and capacitor, an insulating interlayer having a thickness of about 6000 to 8000 angstroms is formed. Subsequently, a contact hole is formed in a desired area and a bit line is formed by depositing, for example, Al or Al-Si with about 4000 to 5000 angstroms in thickness and patterning. The bit line can be formed directly on the substrate, but it is preferred to connect to the substrate through the intermediary of a contact pad such as polysilicon.

In the layout structure of DRAM of the present invention, the DRAM cell units adjacent to each other in the direction of Y are arranged to shift toward the direction of X a distance about one third of the width of the cell unit, whereby the DRAM cell is arranged entirely in X-Y direction. As a result, the distance between the respective DRAM cell units is significantly reduced compared with that of the conventional cell units. Therefore, further integration can be realized. In addition, although the number of word lines forming the gate of the transistor elements of each DRAM cell unit is increased owing to the one third shift of the DRAM cell unit, the displacement of the bit contact and capacitor element 2 in the DRAM cell unit A arranged in the direction of Y is balanced.

A preferred example of a DRAM of the present invention is described in detail as follows:

FIGS. 1(a) to 1(c) show an example of the DRAM of the present invention and FIG. 2 shows a diagram of equivalent circuit of the DRAM cell unit. FIG. 1(a) is a layout structure in part. FIG. 1(b) is a sectional view taken along line B—B' in FIG. 1(a). FIG. 1(c) is a sectional view taken along line A—A'.

As is seen from these figures, the DRAM of the present invention comprises a number of DRAM cell units A1, A2, ... An each of which includes a pair of DRAM cells I and II and arranged in X-Y direction. In the DRAM cells unit, ferroelectric type capacitor elements C are arranged to connect to the right and left sides of the bit contact formation region 1, which is connected to the bit line 14, through the intermediary of transistor element Tr.

In this case the respective transistor elements Tr can be controlled by the word lines 3 consisting of gate polysilicon 7, which are protected with an insulating protective film 8 such as $SiO_2$. The capacitor element C is formed by laminating a lower electrode 10 consisting of polysilicon, a ferroelectric film 11 consisting of PZT (1000 to 3000 angstroms in thickness) and an upper electrode 12 consisting of polysilicon (2000 to 3000 angstroms in thickness) and connected to the transistor element Tr through the intermediary of respective active areas 4. In these figures, the reference numeral 9 designates a bit line contact pad formed of polysilicon, 2 indicates a capacitor element formation area, 5 indicates a silicon substrate, 6 indicates an element isolation region, 13 indicates an insulating interlayer, 14 indicates a bit line and the letter G indicates a gate, respectively.

As shown in FIG. 1(a), in the DRAM cell units A1, A2 ... An as described above one of the capacitor element formation areas 2 is disposed so as to be located between two capacitor element formation areas 2, 2 of the DRAM cell units adjacent to each other in the direction of Y.

The DRAM can be manufactured, for example, by a method shown in FIG. 3.

Figure 3A:
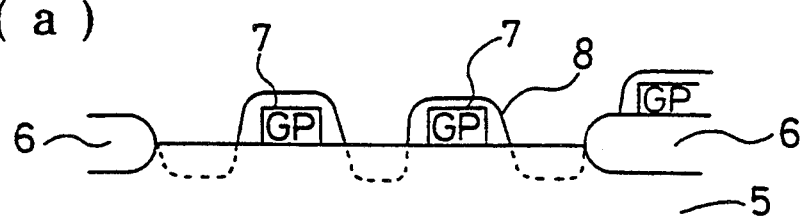
FIGS. 3(a) to 3(d) show a manufacturing process of the DRAM of the FIGS. 1(a) to 1(c).

First, an element formation region was prepared on silicon substrate 5 by forming an element isolation region 6 consisting of a field oxide film as shown in FIG. 3(a). In this region a gate polysilicon 7 was formed with a thickness of 3500 to 4000 angstroms. Then, $SiO_2$ was deposited thereon by a CVD method and etched back to form a protective film 8. Ions were implanted thereto to form an N-type impurity diffused region.

Figure 3B:
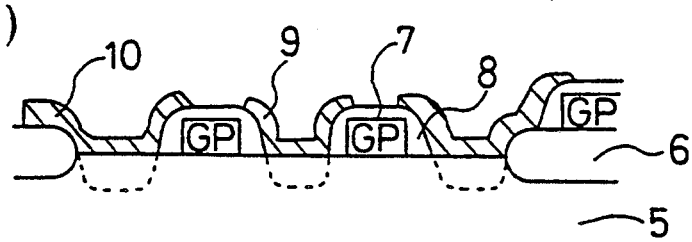

Next, polysilicon was deposited and patterned to form a lower electrode 10 of the respective capacitor elements and a bit line contact pad 9 (see FIG. 3(b)).

Figure 3C:
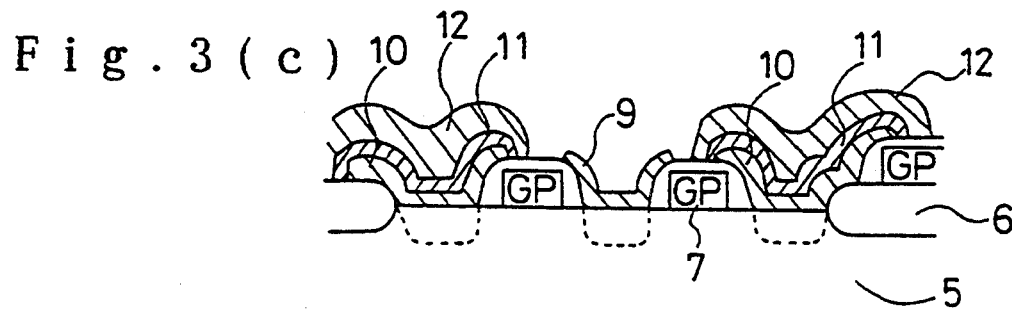

Subsequently, PZT film 11 was formed by a CVD method or a sputtering method on the lower electrode 10 and platinum was further deposited thereon, followed by patterning to form the upper electrode 12 (see FIG. 3(c)).

Figure 3D:
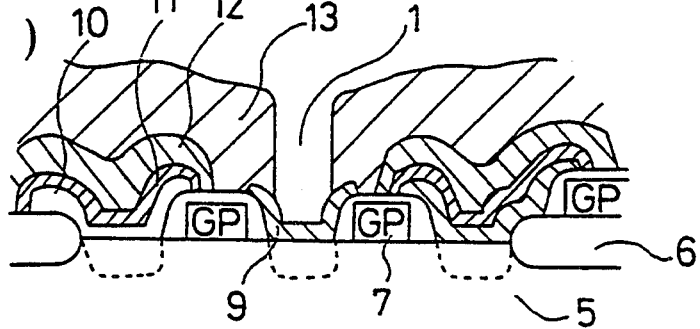

As shown in FIG. 3(d), the device was entirely covered with an insulating interlayer 13 (6000 to 8000 angstroms in thickness) and flattened. A bit contact formation region (hole) 1 was formed thereon and Al (4000 to 5000 angstroms in thickness) was deposited thereon. Then, it was patterned to form a metal wiring layer (bit line), thereby obtaining the DRAM of the present invention shown in FIG. 1.

Figure 4:
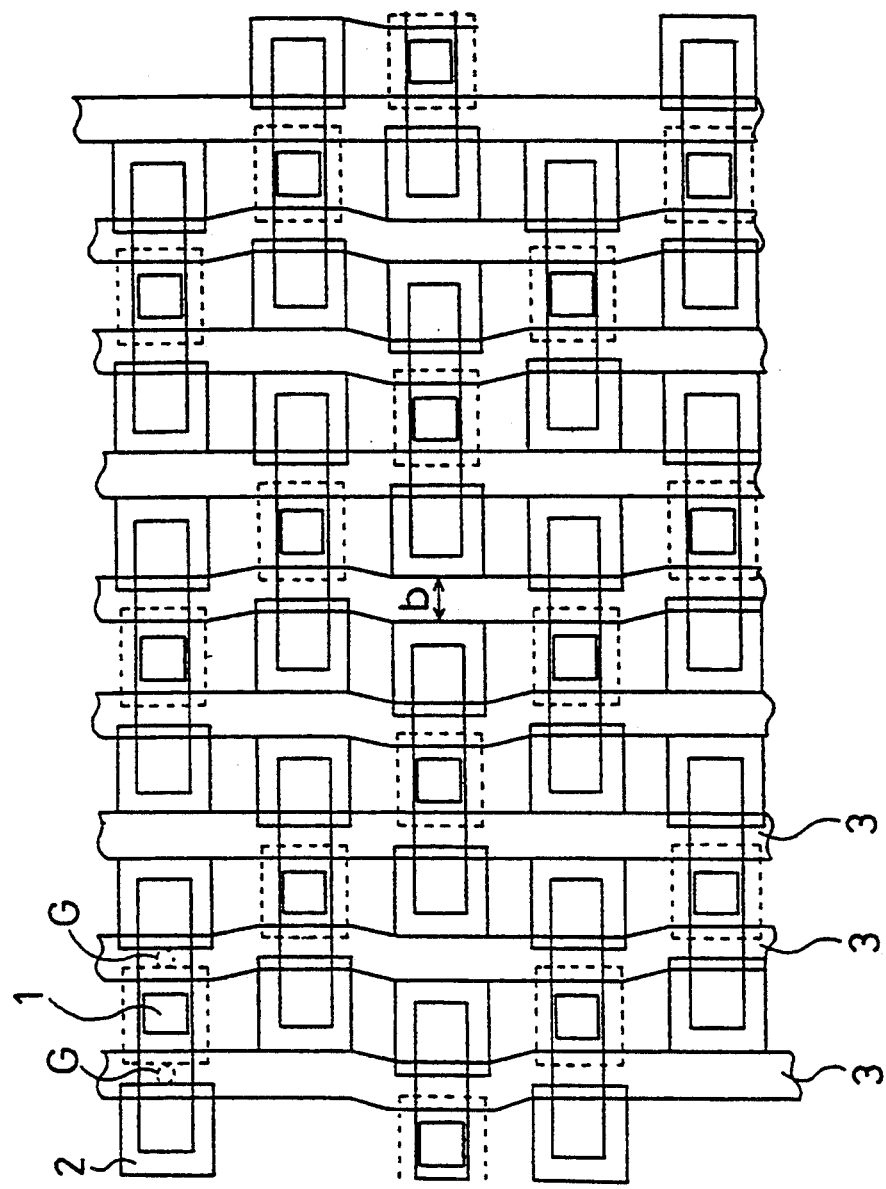
FIG. 4 shows a lay out structure of the DRAM of the present invention.
Figure 5:
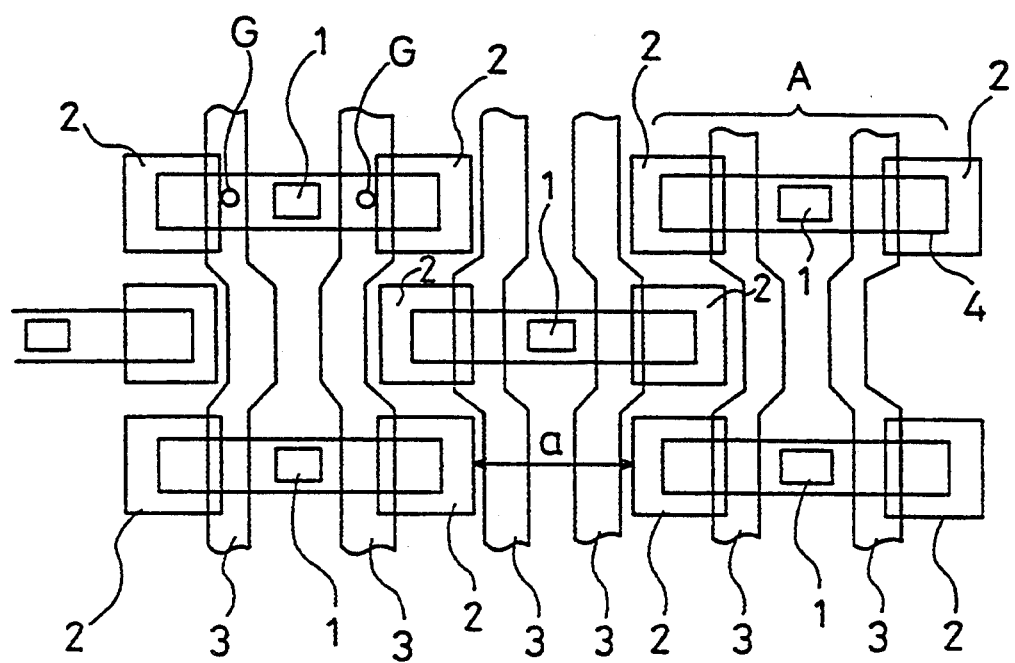
FIG. 5 shows a lay out structure of a conventional type DRAM.

Thus the obtained DRAM has a layout structure shown in FIG. 4. In this figure, the width b is 1 micron and the size of each DRAM cell is 0.25 square micron (0.5 rule).

According to the DRAM of the present invention which has a specific displacement of the DRAM cell units as described above, the distance between the respective DRAM cell units in the direction of X is significantly reduced compared with that of the conventional cell units and high integration can be realized.

What we claimed is:

1. A dynamic random access memory which includes a plurality of rows of DRAM cell units each having a bit contact region and DRAM cells each formed in an active region, wherein the DRAM cells, each comprised of a transistor and a capacitor connected to the transistor, are arranged symmetrically to the right and left sides of a bit contact connected with the active region to form the DRAM cell unit; and wherein each row of DRAM cell units is arranged with a prescribed uniform pitch in an X direction and further arranged in an orthogonal direction of Y shifted by about one third of the pitch in the X direction with respect to adjacent rows, whereby the prescribed uniform pitch produces uniformity in device density and is sufficiently small as to allow high integration density of said DRAM cell units.

2. The dynamic random access memory according to claim 1, wherein one capacitor disposed in a DRAM cell unit is placed between two capacitors disposed in other DRAM cell units adjacent to each other in the direction of Y.

3. The dynamic random access memory according to claim 1, wherein the capacitor includes a ferroelectric film as an insulating film.

4. The dynamic random access memory according to claim 1 wherein the DRAM cell units of each row are separated by a distance of about 1 micron and the size of each DRAM cell is about 0.25 square micron.

* * * * *